United States Patent [19]

Pérault et al.

[11] 4,146,881
[45] Mar. 27, 1979

[54] ANALOG-TO-DIGITAL CONVERTER

[75] Inventors: Claude Pérault, Chatenay-Malabry; Marcel Y. Parot, Quintal Annecy, both of France

[73] Assignee: International Standard Electric Corporation, New York, N.Y.

[21] Appl. No.: 810,058

[22] Filed: Jun. 27, 1977

[30] Foreign Application Priority Data

Jul. 8, 1976 [FR] France .................... 76 20873

[51] Int. Cl.² .......................................... H03K 13/20
[52] U.S. Cl. ............................................ 340/347 AD
[58] Field of Search ................. 340/347 AD, 347 M; 307/356; 324/99 D

[56] References Cited

U.S. PATENT DOCUMENTS 3,886,541  5/1975  Watson .................... 340/347 AD

OTHER PUBLICATIONS

Smarandoiu "IEEE Journal of Solid State Circuits" Jun. 1976, pp. 408–410.

Primary Examiner—Charles D. Miller
Attorney, Agent, or Firm—William T. O'Neil

[57] ABSTRACT

An analog-to-digital converter characterized in that it includes a generator supplying a substantially linear voltage ramp, a source of at least two reference voltage levels precisely related one with respect to the other (one of which may be ground), an input for an analog signal whose voltage level is to be expressed in digital form, a comparator for comparing the increasing voltage of the ramp and the three voltage levels in order to identify the instants when the ramp reaches these levels, time/numerical conversion means for producing from these instants, a first number corresponding to the time for the ramp to go from the first reference voltage level to the second one, and a second number corresponding to the time for the ramp to go from one of the reference levels to the input analog signal level, and digital counting means arranged to carry out the quotient of these numbers, the quotient representing, in a digital form, the level of the input analog signal.

6 Claims, 4 Drawing Figures

ANALOG-TO-DIGITAL CONVERTER

BACKGROUND OF THE INVENTION

1. Field of the Invention

The invention relates to electronic analog-to-digital converters.

2. DESCRIPTION OF THE PRIOR ART

In the prior art, electronic analog-to-digital converters have been extensively described in the technical and patent literature in various forms. The text, ELECTRONIC ANALOG AND HYBRID COMPUTERS, by Korn and Korn, 2nd Edition, McGraw-Hill Book Company, 1972, illustrates and describes various analog-to-digital converters. In Chapter 5 thereof and, more particularly, beginning at Section 5-10, the so-called ramp, comparator converter illustrated in FIGS. 5-29 of the above referenced textbook, defines the general type of A/D converter to which the present invention applies.

Most prior art digital converters require more than one reference source with a voltage of either polarity to be measured. Other prior art converters require the use of highly precise circuit components or are not readily adapted to the use in micro-processors.

The manner in which the present invention improves upon the state of the art, particularly in respect to the above disadvantages of the prior art A/D converters, will be evident as this description proceeds.

SUMMARY

It may be said to be the general objective of the present invention to provide an A/D converter in which one of the references may be ground, only one additional reference voltage being required, and which is capable of accurate measurement of voltages of either polarity without the use of highly accurate circuit components or other expensive elements.

The invention involves the generation of a bipolar, substantially linear, saw-toothed or ramp waveform, symmetrical about the ground reference potential. A two-reference potential, including the ground reference and the unknown voltage are cyclical compared and the instants of equality with the sawtooth or ramp are identified. Two-numerical values (digital numbers) are generated, the first representing the time for the ramp to go from a first reference voltage to the second reference voltage. The second number corresponds to the time for the ramp to go from one of the reference levels to the input analog signal level which is to be converted to digital form. A unique digital counter, capable of up and down counting, is controlled to carry out the quotient of those two numbers, this quotient representing the input analog signal in digital form.

The details of the manner in which the present invention is implemented in a typical and illustrative embodiment are hereinafter described.

DESCRIPTION OF THE PREFERRED EMBODIMENT

Figure 1:
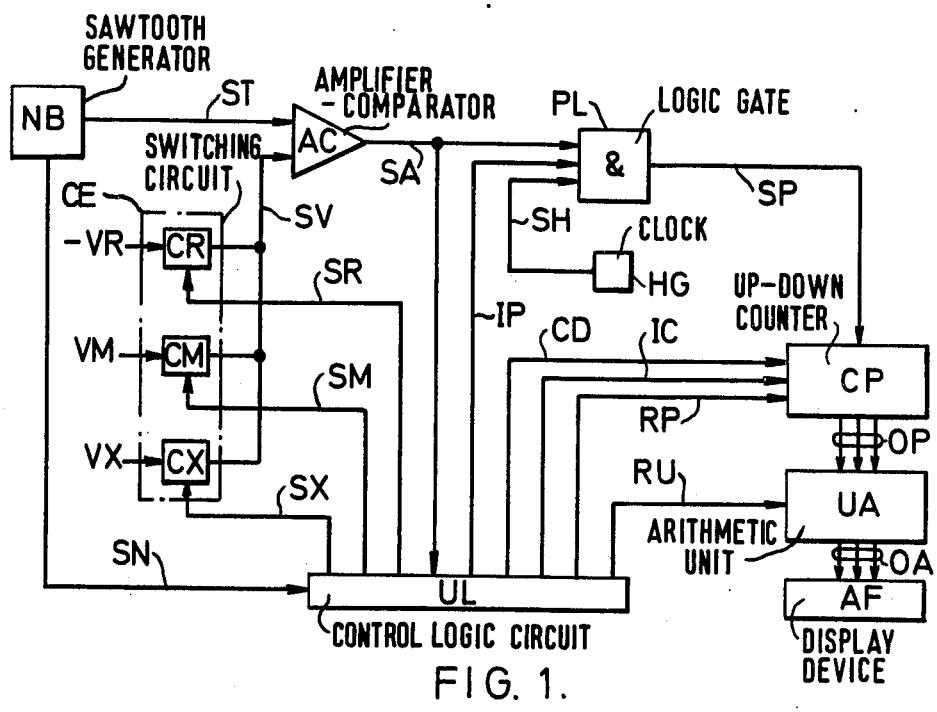
FIG. 1 is a schematic block diagram of an embodiment of an analog-to-digital converter, according to the invention.

Referring to FIG. 1, the block diagram of an embodiment of the analog-to-digital converter, according to the invention, will be first described. This converter includes a generator NB supplying sawtooth pulses ST, of amplitude VA, symmetrical with respect to the voltage 0; and a switching circuit CE formed by three switches CR, CM and CX, each respectively receiving a reference negative voltage $-VR$, a mean voltage VM and an analog signal (of voltae Vx) to be converted, related as follows:

$$-VA < -VR < VM$$

and $$-VR < Vx < VR.$$

The aforementioned switching circuit CE supplies an output signal SV to an amplifier-comparator AC which also receives the signal ST from the generator NB and generates a comparison signal SA. This signal SA changes state each time the amplitude of signal ST equals that of signal SV.

FIG. 1 also includes a clock HG, supplying clock pulses SH, a control logic circuit UL, which receives the signal SA from the amplifier-comparator AC and a signal SN from the generator NB, and supplies, in response, control signals SR, SM and SX, respectively, to switches CR, CM and CX.

An AND logic gate PL receives signals SA and SH, respectively, from the comparator AC and the clock HG, as well as a signal IP from the control logic UL, and supplies, in response, counting pulses SP.

An up-down counter CP is controlled by signals CD, IC and RP from the control logic UL, and receives the counting pulses SP supplying in response, a code combination OP indicating coding pulse position.

An arithmetic unit UA is controlled by a signal RU from the control logic UL and receives the coded combination OP, supplying, in response, a new coded combination OA to a display device AF.

It will be first assumed that the generator NB is at rest and the amplitude of its output signal ST is equal to $-VA$. The signal SN supplied by this generator to the logic circuits UL is than at zero. The control logic UL correspondingly supplies "0" signals for SM and SX and a "1" signal for SR. It also supplies the reset signal RP for the up-down counter CP as well as "0" signal IP to the logic gate PL.

Those conditions result, on the one hand, in setting switches CM and CX in the "off" position and the setting in "on" position of switch CR. The amplitude of the signal SV supplied on one input of the amplifier-comparator AC is thus equal to $-VR$. The comparison signal SA is at "0".

The logic gate PL whose two inputs are at "0" supplies a "0" signal at SP, and therefore no counting pulse is supplied to the up-down counter CP which remains in its reset condition.

When generator NB next operates to generate a sawtooth cycle, the amplitude of the signal ST increases. As soon as this amplitude reaches the value of the voltage −VR, amplifier-comparator AC, whose two inputs are at the same level, changes state and supplies a "1" comparison signal SA. This signal is supplied to the control logic UL and to the gate PL.

The control logic UL supplies, in response, on the one hand, a "1" signal IP towards the gate PL and a "1" counting signal CD towards the up-down counter CP and, on the other hand, a "1" signal SM and "0" signals SR and SX towards the input switching circuit CE.

The gate PL, which receives signals SA and IP of logic level "1", becomes conducting and retransmits the clock pulses SH as counting pulses SP towards the up-down counter CP. As the latter receives a "1" counting signal on CD, it operates as an adder and up-counts the pulses SP.

The switch CR, which receives a "0" signal SR, becomes blocked and no longer retransmits the voltage −VR. The switch CX, which receives a "0" signal SX, remains blocked. The switch CM, which receives a "1" signal SM, changes state and retransmits on its output the voltage VM supplied on its input. The amplitude of the signal SV, supplied on one input of the amplifier-comparator AC, is thus equal to VM. The output signal SA of this comparator remains at "1". The amplitude of the output signal ST of the generator NB continues to increase, and the operation of the converter of FIG. 1 continues as above-described, the up-down counter CP counting the pulses SP supplied by the gate PL.

As soon as the amplitude of the output signal ST of the generator NB reaches the value VM, the amplifier-comparator AC, whose inputs are then at the same level, changes state and supplies a "0" output signal SA. This signal is supplied to the control logic UL and to the gate PL which becomes non-conducting.

The control logic UL supplies in response, on the one hand, a "0" signal IP and, on the other hand, "0" signals SM, SR and SX which block switches CR, CM and CX.

As the gate PL is off, the up-down counter CP no longer receives counting pulses SP, and it stops in the position corresponding to the P, counting pulses received during the time necessary for the output signal ST of the generator NB to go from the value −VR to the value VM. Accordingly, equation (1) may be written as follows:

$$VM - (-VR) = KP \tag{1}$$

The amplitude of the output signal ST of the generator NB increases and reaches the peak value +VA. The signal SN supplied by NB to the control logic UL goes to "1". The control logic UL then supplies a "1" transfer signal IC to counter CP, the latter providing a coded combination OP on its outputs, representing the number of P received pulses towards the arithmetic unit UA in which this combination is stored.

At the end of a sawtooth cycle, signal ST rapidly decreases and reaches the peak negative value −VA, signal SN then going to "0". The control logic UL then supplies a "0" transfer signal IC.

The control logic UL also supplies "0" signals SM and SX and a "1" signal SR, holding switches CM and CX in blocked position and closing switch CR. The amplitude of the signal SV supplied on one input of the amplifier-comparator AC is thus equal to −VR. The output signal SA of this comparator is held at "0".

The logic gate PL thus supplies a "0" signal SP and no counting pulse is supplied to the up-down counter CP which remains in position P.

When, during initiation of another sawtooth cycle, the amplitude of the output signal ST of the generator NB increases, and reaches −VR, the amplifier-comparator AC, whose two inputs are then at the same level instantaneously, changes state and supplies a "1" comparison signal SA. This signal is supplied to the control logic UL and to the gate PL.

In response, the control logic circuit UL supplies, on the one hand, "1" signal IP to the gate PL and a "0" counting signal CD towards the up-down counter CP and, on the other hand, a "1" signal SX and "0" signals SR and SM to switching circuit CE.

The gate PL, which receives the "1" signals SA and IP, becomes conducting and retransmits the clock pulses SH as counting pulses SP towards the up-down counter CP. As the latter receives a "0" counting signal CD, it operates as a subtractor and downcounts from P to 0 at the rate of the counting pulses.

The switch CR, which receives a "0" signal SR, becomes blocked and no longer retransmits the voltage −VR. The switch CM, which receives a "0" signal SM, remains blocked, but switch CX, which receives a "1" signal SX, changes state and retransmits to its output the voltage Vx supplied on its input. The amplitude of the signal SV supplied on one input of the amplifier-comparator AC is thus now equal to Vx. The output signal SA of this comparator remains at "1". The amplitude of the output signal ST of the generator NB increases, and the operation of the converter of FIG. 1 continues as above-described, the up-down counter CP subtracting the pulses SP supplied by the gate PL.

As soon as the amplitude of the signal ST reaches the value Vx, the amplifier-comparator AC, whose inputs are instantaneously at the same level, changes state and supplies a "0" output signal SA. This signal is supplied to the control logic UL and to the gate Pl, which becomes nonconducting.

The control logic UL supplies in response, on the one hand, a "0" signal IP which locks the gate PL and, on the other hand, "0" signals SM, SR and SX which block switches CR, CM and CX. As the gate PL is nonconducting, the up-down counter CP no longer receives counting pulses SP, and remains stopped in the position $N = P - X$, corresponding to the subtraction of the X counting pulses received during the time necessary for the output signal ST of the generator NB to go from the value −VR to the value Vx from the P counting pulses previously received and defined by equation (1) hereabove.

Assuming that the signal ST is linear (of constant slope) and that the frequency of the clock HG is stable, equation (2) may be written:

$$Vx - 1(-VR) = kX. \tag{2}$$

From these relations (1) and (2), the content N of the up-down counter CP may be expressed by equation (3), as follows:

$$kN = VM - Vx = k(P-X) \tag{3}$$

The amplitude of the output signal ST of the generator NB increases and reaches the peak value +VA. The signal SN supplied by this generator to the control logic UL goes to "1", and control logic UL then supplies a "1" transfer signal IC to the counter CP. The latter supplies, in response, on its outputs a coded combination OP characterizing the number of N pulses to the arithmetic unit UA. This combination is memorized.

As the signal ST decreases from +VA to −VA, the control logic UL supplies a signal RU to the arithmetic unit UA. In response, the latter carries out the division of N by P, the quotient representing the value of the voltage Vx. Indeed, if it is assumed that the mean voltage VM equals 0, there is derived from the relation (1):

$$k = VR/P$$

By replacing k by its value from equation (3), this gives $$Vx = -kN = -VR (N/P)$$

By choosing a reference voltage −VR equal to −1, then $$Vx = -(N/P) \quad (4)$$

This ratio of equation (4) is transmitted by the arithmetic unit UA to the display device AF in the form of a coded combination OA. The value of the voltage Vx is then displayed, or otherwise employed.

Again, as the amplitude of the signal ST reaches the value −VA, the signal SN goes to "0". The control logic supplies, in response to this signal, "0" signals SM and SX and a "1" signal at SR. It also supplies the reset signal RP for the up-down counter CP. The initial position is thus found again and the converter of FIG. 1 starts a second cycle as above-described.

The converter of FIG. 1 makes it possible, in a first step, to obtain a number of pulses characterizing the amplitude difference between a well-known voltage (VM) and a reference voltage (−VR) and, in a second step, to obtain a number of pulses characterizing the amplitude difference between an unknown voltage (Vx) and the reference voltage (−VR). Using an arithmetic unit, similar to the familiar pocket calculators presently widely known and used, it is easy to obtain the ratio of both numbers and the amplitude of the unknown voltage.

Figure 2:
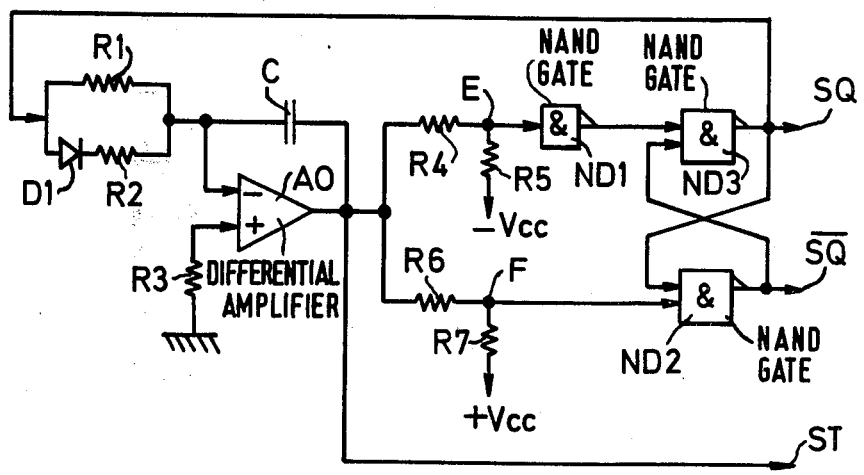
FIG. 2 is a detailed circuit schematic of an embodiment of the generator NB of FIG. 1.

Referring now to FIG. 2, an embodiment of the generator NB of FIG. 1, which supplies sawtooth pulses ST, will be described.

The generator of FIG. 2 includes, in particular, a differential amplifier AO whose inverting input is connected to its output (via a capacitor C), a logic inverter ND1, a bistable circuit constituted by two NAND gates ND2 and ND3, a diode D1 and seven resistors R1 to R7.

The noninverting input of the amplifier AO is connected to reference potential (ground, for example, as illustrated) via resistor R3. The output of this amplifier is connected, on the one hand, to a voltage source −Vcc through the two series-connected resistors R4 and R5 and, on the other hand, to a voltage source +Vcc through two series-connected resistors R6 and R7, respectively, identical to resistors R4 and R5. The common point E of resistors R4 and R5 is connected to the input of the inverter ND1 whose output is connected to one input of the gate ND3. The common point F of resistors R6 and R7 is connected to one input of the gate ND2.

The output of the gate ND3 is connected to the inverting input of the amplifier AO through a network including resistor R1 parallel-connected with the series-circuit constituted by the diode D1 and the resistor R2.

It will be first assumed that the bistable formed by ND2−ND3 is reset and that the output signal SQ of the gate ND3 is at "0" (negative voltage) and the output signal $\overline{SQ}$ of the gate ND2 is at "1" (position voltage). It will be also assumed that the amplifier AO supplies a "0" signal and that, for simplicity, resistors R4 to R7 are such that:

$$R5 = R7 - 2 R4 - 2 R6$$

Under these conditions, the voltage on point F is positive (logic level 1). The gate ND2 which receives on its inputs a "1" signal and the "0" signal SQ, as shown, and supplies the signal $\overline{SQ}$ of logic level "1" as an output.

The voltage at point E is negative (logic level 0), and accordingly, the gate ND3 receives a "1" signal supplied by the inverter ND1 also the "1" signal $\overline{SQ}$ as inputs. It then supplies the "0" signal SQ.

Starting from a steady state, the ampitude of the output signal ST of the amplifier AO, whose inverting input receives the negative signal SQ, increases. As the diode D1 is reverse-biased, the signal SQ is transmitted to the amplifier through the resistor R1 and the slope of the output signal ST of the amplifier AO is defined by the time constant T1 = (R1)(C). The amplitude of the signal ST reaches the value +Vcc/2. According to the chosen example, the voltage on point E becomes equal to 0, the voltage on point F remaining positive.

As soon as the amplitude of the signal ST is sufficiently above Vcc/2, the positive voltage on point E reaches the triggering threshold of the gate ND1 which then supplies a "0" signal at the input of the gate ND3. The latter, which also receives the "1" signal SQ, changes state and the signal $\overline{SQ}$ goes to "1" (positive voltage).

The gate ND2, the two inputs of which are at "1", changes state and the signal $\overline{SQ}$ goes to "0", which has no effect upon the operation of the gate ND3.

The signal SQ is sent to the inverting input of the amplifier AO via resistor R1 and resistor R2 parallel-connected, the diode D1 being now forward biased.

As the signal SQ is positive, the amplitude of the signal ST decreases with a slope T2 defined by:

$$T2 = \frac{C(R1)(R2)}{R1 + R2}$$

Assuming that resistor R2 is one-ninth of the value of resistor R1, the time constant T2 is one-tenth of the time constant T1. The decline of the sawtooth signal ST is thus ten times more rapid than its increase.

When the signal ST falls below +Vcc/2, the voltage on point E becomes negative, and the inverter ND1 supplies a "1" signal, which has no effect upon the operation of the gate ND3 receiving the "0" signal $\overline{SQ}$.

When the signal ST falls below −Vcc/2, the voltage on point F becomes negative, and a "0" signal is supplied on the input of the gate ND2. As the signal SQ is still at "1", ND2 changes state and the signal $\overline{SQ}$ goes to "1". The gate ND3, which receives this signal and the "1" signal from the inverter ND1, changes state. The signal SQ goes to "0" (negative voltage), which has no effect upon the operation of the gate ND2.

The signal SQ is transmitted to the inverting input of the amplifier AO through resistor R1, the diode D1 being reverse-biased, is blocked.

The output signal ST increases with the slope defined by the time constant T1. When the signal ST becomes greater than the voltage −Vcc/2, the voltage on point F becomes positive. A "1" signal is supplied at the input of the gate ND2, which does not influence its operation as this gate receives the "0" signal SQ. The amplitude of the signal ST increases and becomes equal to "0". The initial condition is then restored.

The operation of the sawtooth pulse generator NB continues repetitively as above-described.

Thus, the generator of FIG. 2 fulfills the requirements of the sawtooth generator NB of FIG. 1 by applying a sawtooth pulse ST, whose amplitude VA is approximately equal to the voltage Vcc plus the triggering threshold of the bistable ND2–ND3, and which is symmetrical with respect to the reference voltage. Moreover, this generator NB supplies a "0" signal SQ when the signal ST varies from −VA to +VA and a "1" signal SQ when the signal ST varies from +VA to −VA. This signal is thus the signal SN of FIG. 1.

Figure 3:
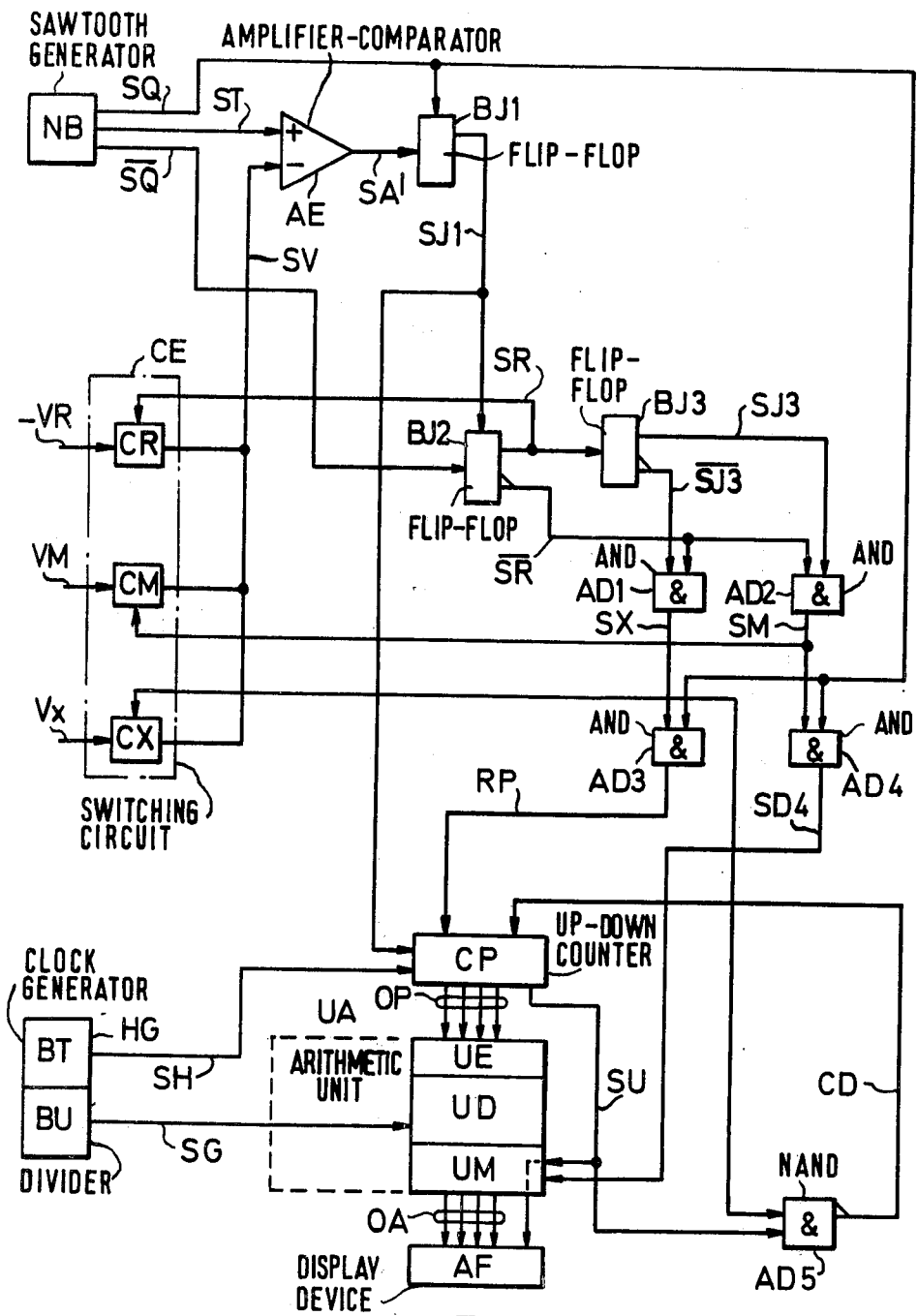
FIG. 3 is a detailed circuit schematic of an embodiment of the analog-to-digital converter of FIG. 1.

Referring now to FIG. 3, an embodiment of the converter of FIG. 1 is shown in more detail and will be described.

Repeated in the detailed diagram of FIG. 3, are the generator NB of sawtooth pulses ST; the clock HG including a time base supplying clock pulses SH, e.g. of 800 kHz frequency, with dividing stage BU supplying pulses SG of 80 kHz frequency; the input switching circuit CE constituted by the three switches CR, CM and CX respectively receiving the voltages −VR, VM and Vx and respectively controlled by the signals SR, SM and SX; the up-down counter CP; the arithmetic unit UA including an input stage UE; a dividing stage UD and a memory stage UM; and the display device AF.

The converter embodiment of FIG. 3 also includes:

an amplifier-comparator AE whose noninverting input receives the sawtooth pulse ST from the generator NB and whose inverting input receives the output signal SV of the input switching circuit CE. The circuit AE supplies a "0" comparison signal SA' when the amplitude of the signal ST supplied on its noninverting input is below the amplitude of the signal SV supplied on its inverting input, and a "1" comparison signal SA' when the instantaneous amplitude of the signal ST is equal or greater than to the amplitude of the signal SV;

and a control logic including three JK flip-flops, BJ1 to BJ3, four AND gates AD1 to AD4 and a NAND gate AD5. The flip-flop BJ1, reset by the signal SQ from the generator NB and controlled by the signal SA' applied at its clock input, supplies a signal SJ1 on its direct output. The flip-flop BJ2, reset by the signal SJ1 and controlled by the signal $\overline{SQ}$ from the generator NB, supplies the signals SR and $\overline{SR}$. The flip-flop BJ3, controlled by the signal SR, supplies signals SJ3 and $\overline{SJ3}$.

The logic AND gate AD1 receives the signals $\overline{SR}$ and $\overline{SJ3}$ and supplies the signal SX and gate AD2 receives the signals $\overline{SR}$ and SJ3 and supplies the signal SM. The logic gate AD3 receives the signals SX and SQ and supplies the reset signal RP for the up-down counter CP, and the gate AD4 receives the signals SM and SQ and supplies a signal SD4 to the arithmetic unit UA. The gate AD5 receives the signal SX and a signal SU supplied by the up-down counter CP via the arithmetic unit UA and supplies, in response, the counting signal CD to the up-down counter CP.

Figure 4:
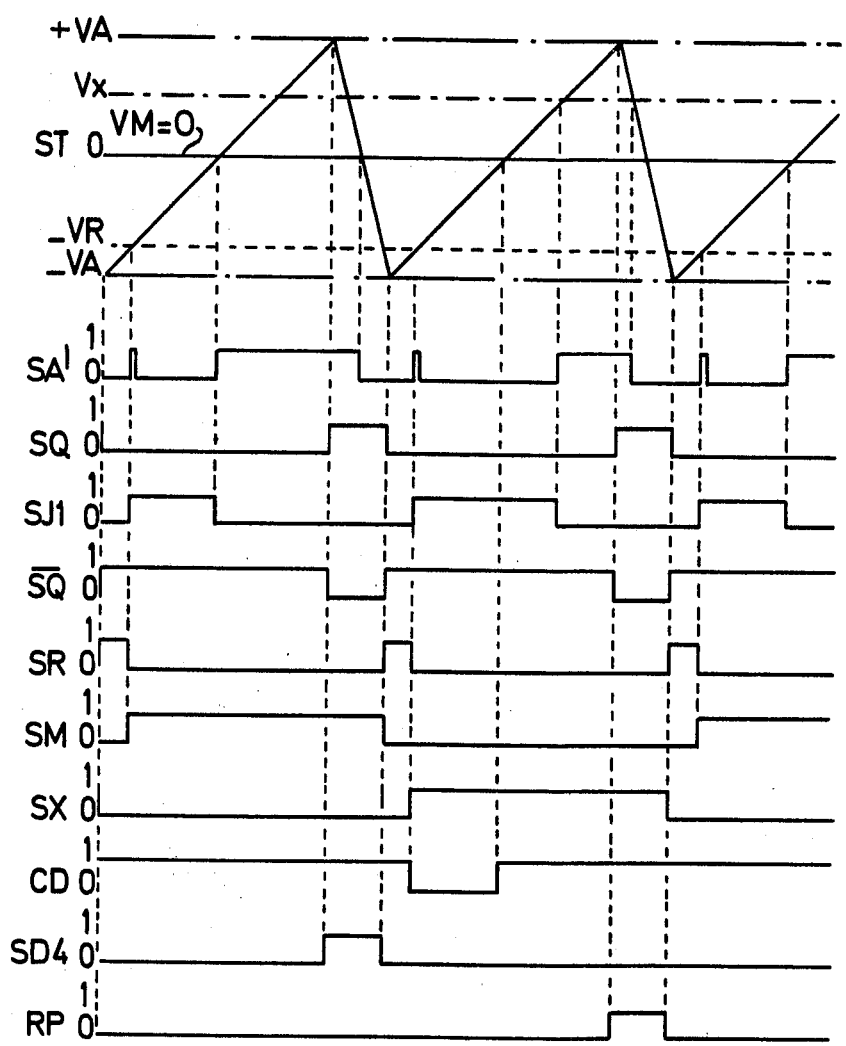
FIG. 4 presents waveshapes illustrating the various signals at various points in the analog-to-digital converter of FIG. 3.

Referring also to the waveshapes of FIG. 4, the operation of the converter of FIG. 3 may now be described.

It will be first assumed that the amplitude of the output signal ST of the generator NB is equal to its negative peak value −VA. The signal SQ supplied by NB is thus at the logic level "0" and the complementary signal $\overline{SQ}$ is at "1" (as described in connection with FIG. 2).

As in the case of FIG. 1, it will be assumed that the reference voltage −VR supplied at the input of the switch CR equals −1V, that the mean voltage VM supplied at the input of the switch CM equals 0V and that the voltage to be converted (Vx) supplied at the input of the switch CX lies between −VR = −1V and + VR = +1V.

It will be also assumed (and checked subsequently) that the flip-flop BJ1 is reset, that the flip-flops BJ2 and BJ3 are set, and that the up-down counter CP previously reset supplies a "1" signal SU, this signal going from one logic level to the other at each reset of the up-down counter.

The flip-flop BJ1 being reset, the signal SJ1 is at "0". It controls the blocking of the up-down counter CP which remains at "0".

The flip-flop BJ2 being set, the control signal SR is at "1" and the signal $\overline{SR}$ is at "0". The switch CR of the input switching circuit CE which receives a "1" control signal SR operates, and accordingly, a signal SV of amplitude −VR = 1V, thus lying between −VA and 0, is supplied at the inverting input of the amplifier-comparator AE.

The amplifier-comparator AE, whose noninverting input receives a signal ST of amplitude −VA smaller than the amplitude −VR supplied on its inverting input, supplies a "0" comparison signal SA'.

The gates AD1 and AD2, which receive a "0" signal $\overline{SR}$, are nonconducting and, therefore, respectively supply "0" control signals SX and SM. These signals result in the nonoperation of switches CX and CM of the input switching circuit CE.

The gate AD5, which receives a "0" signal SX, becomes conducting. Thus, it supplies a "1" counting signal CD to the up-down counter CP.

The gate AD3, which receives the "0" signal SX is nonconducting. Thus, it supplies a "0" reset signal RP to the up-down counter CP, which has no effect thereon.

The gate AD4, which receives the "0" signal SM, is nonconducting. Thus, it supplies a "0" memorizing signal SD4. The system is then in a steady state.

The amplitude of the output signal ST of the generator NB increases and equals −VR = 1V.

The amplifier-comparator AE noninverting input receives the signal ST, whose amplitude becomes equal to the amplitude −VR of the signal SV supplied on its inverting input, and changes state. Therefore, the signal SA' goes to "1".

The flip-flop BJ1 controlled by the leading edge of the signal SA', is set. Consequently, the signal SJ1 goes to "1" and operates the up-down counter CP, the latter also receiving a "1" counting signal CD and accordingly operates as an adder, counting the clock pulses SH supplied by the time base (basic clock frequency pulses) BT.

The flip-flop BJ2 is reset by the leading edge of the signal SJ1. Accordingly, the signal $\overline{SR}$ goes to "0" and the signal SR goes to "1".

The flip-flop BJ3, being insensitive to the trailing edge of the signal SR, remains set and the signals $\overline{SJ3}$ and SJ3 remain respectively at "0" and "1".

The gate AD1 is blocked by the signal $\overline{SJ3}$ and the signal SX remains at "0", whereas the gate AD2, whose inputs $\overline{SR}$ and SJ3 are at "1", supplies a "1" control signal SM.

In the input switching circuit CE, the switch CR, which receives a "0" control signal SR, no longer operates and, therefore, ceases to transmit the voltage $-VR$. The switch CX, which receives a "0" control signal SX, remains blocked and no longer sends the voltage Vx. The switch CM, which receives a "1" control signal SM, operates and transmits the voltage VM — 0V. A "0" signal SV is thus supplied to the inverting input of the amplifier-comparator AE whose noninverting input is approximately at $-VR = -1V$. The output signal SA' of AE goes to "0", and the flip-flop BJ1, being insensitive to the trailing edge of the signal SA', remains set.

The amplitude of the output signal ST of the generator NB continues to increase and becomes instantaneously equal to VM = 0V. As above-described, the amplifier-comparator AE then changes state, the signal SA' thus going to "1".

The flip-flop BJ1, controlled by the leading edge of the signal SA', is reset and the signal SJ1 goes from "1" to "0", thus blocking the up-down counter CP. P is the number of clock pulses SH which are counted and stored by the latter during the time interval in which the signal ST is at "1". This number P thus represents the time for the signal ST to go from $-VR = -1V$ to VM = 0V and may thus be expressed as equation (5).

$$kP = VM - (-VR) = 1 \tag{5}$$

As the amplitude of the output signal ST of the generator NB continues to increase, it reaches the peak value $+VA$. As hereinbefore explained, the signal SQ then goes from "0" to "1", and the complementary signal $\overline{SQ}$ goes from "1" to "0". The signal SQ is retransmitted, on the one hand, to the reset input of the flip-flop BJ1 already at "0" and, on the other hand, to the input of the gate AD4. The latter, whose other input receives the "1" control signal SM, becomes conducting and its output signal SD4 goes from "0" to "1". This signal, transmitted to the memory stage UM of the arithmetic unit UA, controls the storing of the position P of the up-down counter CP supplied in the form of a coded combination OP.

Contemporaneously, the amplitude of the output ST of the generator NB decreases. As soon as this amplitude falls below VM = 0, the amplifier-comparator AE changes state. The signal SA' thus goes from "1" to "0", which has no effect upon the operation of the different circuits of the converter of FIG. 3, since the flip-flop BJ1 is insensitive to the trailing edge of SA'.

The amplitude of the output signal ST of the generator NB reaches the negative peak value $-VA$, and then the signals SQ and $\overline{SQ}$, respectively, go to "0" and "1". The signal $\overline{SQ}$ then sets the flip-flop BJ2. The signal $\overline{SR}$ thus goes from "1" to "0" and blocks the gates AD1 and AD2. The control signal SX is thus held at "0" and the control signal SM goes from "1" to "0". The switch CX remains blocked and the switch CM becomes blocked. The gates AD3 and AD4, respectively, controlled by the "0" signals SX-SQ and SM-SQ are nonconducting. The memorizing signal SD4 (memory UM actuating signal) thus goes from "1" to "0". Contemporaneously, the output signal SR of the flip-flop BJ2 goes to "1" and causes, on the one hand, the reset of the flip-flop BJ3 and, on the other hand, the change of state of the switch CR of the input switching circuit CE. A signal SV of amplitude $-VR = -1V$ is thus then supplied at the inverting input of the amplifier-comparator AE.

The amplitude of the output signal ST of the generator NB continues to increase and becomes equal to $-1V$. The amplifier-comparator AE changes state and the signal SA' goes from "0" to "1".

The flip-flop BJ1, controlled by the leading edge of the signal SA' is set, and the signal SJ1 thus goes to "1" and controls the reset of the flip-flop BJ2. The signal SR thus goes to "0", but again, this has no effect on the flip-flop BJ3 which remains reset. The signal $\overline{SR}$ goes to "1", and the gate AD1, whose inputs receive the "1" signals $\overline{SR}$ and $\overline{SJ3}$, becomes conducting. The signal SX goes to "1", and the gate AD2 remains nonconducting due to the signal SJ3. The signal SM thus remains at "0".

The switch CR, which receives a "0" signal SR, becomes blocked; the switch CM, whose control signal SM is held at "0" remains blocked; and the switch CX, whose control signal SX goes from "0" to "1", operates. A signal SV of amplitude Vx is thus supplied at the inverting input of the amplifier-comparator AE.

The amplifier-comparator AE, whose inverting input receives a signal SV of amplitude Vx superior to the amplitude $-VR = -1V$ of the signal ST supplied on its noninverting input, supplies a "0" signal SA'. Contemporaneously, the gate AD5, whose two inputs respectively receive the "1" signals SX and SU, becomes nonconducting. The counting signal CD goes to "0". Furthermore, as the up-down counter receives a "0" signal CD, it operates as a subtracter, subtracting the clock pulses SH supplied by the time base BT.

It is assumed that the voltage Vx is greater than the mean voltage VM, that is, according to the chosen example, that Vx is positive.

As soon as the amplitude of the output signal ST of the generator NB equals 0 instantaneously (the clock pulse frequency and the ascending slope of the signal ST being constant), the up-down counter has subtracted a number of clock pulses equal to P. The counter CP is thus reset, and it then supplies a "0" signal SU which renders the gate AD5 conducting. The counting signal CD then goes to "1", and the up-down counter CP then operates as an adder.

The amplitude of the signal ST continues to increase and becomes equal to Vx. As above-described, the amplifier-comparator AE changes state and the signal SA' goes from "0" to "1", thus resetting the flip-flop BJ1. The signal SJ1 goes to "0" and blocks the up-down counter CP in the position $N = P - X$ corresponding to the subtraction of the X clock pulses received during the time for the output signal ST of the generator NB to go from the value $-VR = -1V$ to the value Vx from the P clock pulses previously received during the time for the signal ST to go from the value $-VR = -1V$ to the value VM = 0.

This position N of the up-down counter CP is sent in the form of a coded combination OP to the arithmetic unit UA which carries out the operation N/P. The quotient of this operation represents, as above-seen (FIG. 1), the amplitude of the voltage Vx, and its digital value is retransmitted in the form of a coded combination OA, to the display device AF along with the signal SU representing the sign of the voltage Vx.

It will be realized that Vx, being assumed positive, the number X of subtracting pulses is greater than the number P of adding pulses, the up-down counter CP having started from the position P, thence to the position O after having subtracted the first P pulses. The signal SU supplied by this up-down counter then went from "1" to "0". When Vx is negative (lying between −VR and O), the number X of subtracted pulses is smaller than the number P of added pulses. The up-down counter CP starts from the position P and subtracts X pulses without passing through O. The signal SU is held at "1", thus the signal SU may be used to indicate the sign of the voltage Vx.

The amplitude of the signal ST increases and reaches the peak value +VA. The signals SQ and $\overline{SQ}$, respectively, go to "1" and "0". The gate AD3 whose inputs receive the "1" signals SX and SQ becomes conducting. The signal RP goes to "1" and causes the reset of the up-down counter CP which then supplies a "1" signal SU.

The amplitude of the signal ST decreases in the hereinbefore described manner, and as soon as it falls below the amplitude of the voltage Vx, the amplifier-comparator AE changes state. The signal SA' goes to "0", which has no effect upon the operation of the circuits of the FIG. 3.

When the amplitude of the signal ST reaches the negative peak value −VA, the signals SQ and $\overline{SQ}$ respectively go to "0" and "1". The flip-flop BJ2 controlled by the leading edge of the signal $\overline{SQ}$ is set. The signal $\overline{SR}$ goes to "0" and blocks the gates AD1 and AD2. The signal SX goes from "1" to "0" and blocks the gate AD3. The reset signal RP of the up-down counter CP thus goes from "1" to "0". On the other hand, the gate AD5 rendered conducting by the signal SX supplies a "1" counting signal CD.

The flip-flop BJ3 controlled by the "1" signal SR is set.

The initial position is then repeated and the operation of the converter continues repetitively as above-described.

The converter, according to the present invention, will be seen to supply at the output of an up-down counter, two coded data signals representing two numbers of clock pulses whose quotient characterizes the amplitude of an unknown voltage.

The converter described according to the invention advantageously uses only one reference voltage (−VR) other than ground, and no sampling is necessary except in respect to the reference signal (−VR).

The preceding description has been given as a typical example, but numerous alternatives and variations will suggest themselves to those of skill in this art without departing from the scope of the invention. In particular, various parameter values have only been given to facilitate the understanding of the invention and may vary with each type of application.

What is claimed is:

1. An analog-to-digital converter having an analog signal input and a digital signal output, comprising:
    means providing a repetitive linear voltage sawtooth wave;
    means providing first and second reference voltage levels precisely related to each other;
    a comparator for comparing the instantaneous voltage of said sawtooth wave with that of said signal input and with said reference levels, said comparator generating discrete corresponding identifying signals identifying the times at which the instantaneous voltage of said ramp passes through the point of equality with each of said input and said reference levels;
    means responsive to said identifying signals to produce digital numerical values, a first of said numerical values corresponding to the time between said identifying signal representing equality of said instantaneous sawtooth voltage with said first and second reference levels, and a second of said numerical values corresponding to the time between said identifying signals representing equality of said instantaneous sawtooth voltage with said input signal voltage and a predetermined one of said reference levels;
    and means for producing a third digital numerical value corresponding to the quotient derived by dividing said second numerical value by said first numerical value, said third numerical value being the digital equivalent of said signal at said analog input.

2. Apparatus according to claim 1 in which one of said reference levels is defined as ground.

3. Apparatus according to claim 1 in which said ramp is bipolar about said ground level and the other of said references is slightly less in absolute value than the initial voltage level of said ramp.

4. Apparatus according to claim 3 in which said means to produce said first and second digital numerical values includes a clock supplying pulses at a predetermined relatively high frequency and a counter to count said pulses between said identifying signals.

5. Apparatus according to claim 1 in which said means to produce said first and second digital numerical values includes a clock supplying pulses at a predetermined relatively high frequency and a counter to count said pulses between said identifying signals.

6. Apparatus according to claim 5 in which said counter includes a means for identifying which of the times corresponding to said first and second digital numerical values is the greatest.

* * * * *